(12) United States Patent
Sagal et al.

(10) Patent No.: US 7,038,009 B2
(45) Date of Patent: May 2, 2006

(54) THERMALLY CONDUCTIVE ELASTOMERIC PAD AND METHOD OF MANUFACTURING SAME

(75) Inventors: E. Mikhail Sagal, Wakefield, RI (US); Kevin A. McCullough, North Kingstown, RI (US); James D. Miller, Marietta, GA (US)

(73) Assignee: Cool Shield, Inc., Warwick, RI (US)

( * ) Notice: Subject to any disclaimer, the term of this patent is extended or adjusted under 35 U.S.C. 154(b) by 303 days.

(21) Appl. No.: 10/225,924

(22) Filed: Aug. 22, 2002

(65) Prior Publication Data

US 2003/0044631 A1 Mar. 6, 2003

Related U.S. Application Data

(60) Provisional application No. 60/316,486, filed on Aug. 31, 2001.

(51) Int. Cl.
*C08F 6/00* (2006.01)

(52) U.S. Cl. .......... 528/481; 524/404; 524/424; 524/428; 524/430; 524/432; 524/437; 524/440

(58) Field of Classification Search .......... 524/404, 524/424, 428, 430, 437, 440, 439, 499, 543, 524/551, 565, 588, 589; 528/481
See application file for complete search history.

(56) References Cited

U.S. PATENT DOCUMENTS

| 4,155,402 | A | 5/1979 | Just | 165/46 |
|---|---|---|---|---|
| 4,826,896 | A | 5/1989 | Procter | 523/443 |
| 5,011,870 | A | 4/1991 | Peterson | 523/220 |
| 5,011,872 | A | 4/1991 | Latham et al. | 523/440 |
| 5,021,494 | A | 6/1991 | Toya | 524/404 |
| 5,106,540 | A | 4/1992 | Barma et al. | 252/511 |
| 5,490,319 | A | 2/1996 | Nakamura et al. | 29/596 |
| 5,536,568 | A | 7/1996 | Teruo | 428/327 |
| 5,580,493 | A | 12/1996 | Chu et al. | 252/511 |
| 5,681,883 | A | 10/1997 | Hill et al. | 524/404 |
| 5,945,217 | A | 8/1999 | Hanrahan | 428/389 |
| 6,048,919 | A | 4/2000 | McCullough | 524/404 |
| 6,251,978 | B1 | 6/2001 | McCullough | 524/404 |
| 6,652,958 | B1 * | 11/2003 | Tobita | 428/298.1 |
| 6,710,109 | B1 * | 3/2004 | McCullough et al. | 524/404 |
| 2001/0049028 | A1 * | 12/2001 | McCullough | 428/614 |
| 2003/0038278 | A1 * | 2/2003 | Ishihara | 252/500 |
| 2003/0040563 | A1 * | 2/2003 | Sagal et al. | 524/404 |

* cited by examiner

*Primary Examiner*—Randy Grulakowski
*Assistant Examiner*—Marc S Zimmer
(74) *Attorney, Agent, or Firm*—Barlow, Josephs & Holmes, Ltd.

(57) ABSTRACT

The present invention relates to thermally conductive, elastomeric pads and methods for manufacturing such pads. The methods involve injection-molding a thermally conductive composition comprising about 30 to 60% by volume of an elastomer polymer matrix and about 25 to 60% by volume of a thermally conductive filler material. The resultant pads have heat transfer properties and can be used as a thermal interface to protect heat-generating electronic devices.

5 Claims, 1 Drawing Sheet

THERMALLY CONDUCTIVE ELASTOMERIC PAD AND METHOD OF MANUFACTURING SAME

CROSS-REFERENCE TO RELATED APPLICATIONS

This application is related to and claims priority from earlier filed Provisional Patent Application No. 60/316,486 filed Aug. 31, 2001.

BACKGROUND OF THE INVENTION

The present invention relates to thermally conductive elastomeric pads and methods for manufacturing such pads. Particularly, the pads comprise an elastomer polymer matrix and a thermally conductive filler material. The pads produced by these methods can be used as thermal interfaces to dissipate heat from heat-generating electronic devices.

Electronic devices such as semiconductors, microprocessors, and circuit boards can generate a substantial amount of heat that must be removed in order for the device to function properly. The industry uses thermally conductive compositions to dissipate heat from such electronic components. Typically, such compositions comprise a base polymer matrix and thermally conductive filler material.

For example, Peterson, U.S. Pat. No. 5,011,870 discloses thermally conductive organosiloxane compositions comprising a polyorganosiloxane and a mixture of thermally conductive fillers that includes aluminum nitride.

McCullough, U.S. Pat. No. 6,251,978 discloses a thermally conductive composition comprising a polymer base matrix (liquid crystal polymer) and thermally conductive fillers (aluminum, alumina, copper, magnesium, brass, carbon, and boron nitride).

Conventional thermally conductive compositions can be used in a variety of ways. For example, a heat-generating device (e.g., electronic part) and an adjacent heat-dissipating article (e.g., heat sink) first are secured in place by mechanical means using clips or screws. Thermally conductive pastes or greases comprising polysiloxane oils loaded with fillers are then smeared onto these components. The thermally conductive greases tend to have initially good film-forming and gap-filling properties. For example, small gaps may exist between the heat sink and electronic part, where these components interface with each other. The uneven mating surfaces of these components can cause such gaps. The thermal greases tend to seep into these gaps bringing the heat sink and electronic part into initial contact with each other. However, it has been found that such thermal greases have poor adhesive properties and will ultimately seep out. This seepage causes air voids to form between the two surfaces resulting in hot spots. Moreover, the mechanical fasteners may exert excessive pressure on the heat sink and accelerate the seepage. It has been reported that seeping polysiloxane oils can evaporate and re-condense on sensitive parts of surrounding microcircuits. The re-condensed oils lead to the formation of silicates that can interfere with the microcircuits and cause the microprocessor to fail in operation.

In the case of polysiloxanes and thermoplastic polymers, these materials are typically cast in sheet form and die-cut into desired shapes corresponding to the shapes of the heat sink and heat-generating device. The resulting pre-formed sheet is attached to the surface of the heat-generating device, and the heat sink is secured by means of clips or screws. These pre-cut, thermally conductive sheets solve the problems associated with the above-described greases. However, an operator may find it difficult to precisely cut the sheets to specific configurations. Thus, the sheets may not have the proper geometry to provide an optimum pathway for heat-transfer between the heat-generating device and heat sink. Further, the added step of cutting and manually applying the preformed sheets adds cost to the assembly process. The sheets may have non-uniform thickness and vary in their effectiveness to transfer heat. Finally, while these sheet materials are suitable for filling undesirable air gaps, they are generally less thermally conductive than the heat sink member. Thus, these sheets can detract from the overall thermal conductivity of the assembly.

In view of the foregoing problems, it would be desirable to have a method for making a thermally conductive elastomeric pad, where no further processing or tooling is required to produce the final shape of the pad. In addition, the pad should be capable of providing a tightly conforming interface between heat-generating and heat-dissipating devices. The present invention provides such an elastomeric pad and the methods for making such a pad.

SUMMARY OF THE INVENTION

The present invention relates to a thermally-conductive, elastomeric pad and the methods for making such a pad. In general, the method comprises the steps of: a) injecting a molten composition comprising about 30 to about 60% by volume of an elastomer polymer matrix and about 25 to about 60% by volume of a filler material into a mold, b) cooling the composition, and c) removing the composition from the mold. Preferably, the composition has a thermal conductivity of greater than 3 W/m° K., and more preferably greater than 22 W/m° K.

The elastomer polymer may be selected from the group consisting of styrene-butadiene copolymer, polychloroprene, nitrile rubber, butyl rubber, polysulfide rubber, ethylene-propylene terpolymers, polysiloxanes, and polyurethanes. Preferably, the elastomer is a polysiloxane (silicone). The filler material can have a relatively high aspect ratio of 10:1 or greater, or a relatively low aspect ratio of 5:1 or less.

In one embodiment of the invention, the composition comprises i) about 30 to about 60% by volume of an elastomer polymer matrix, ii) about 25 to about 60% by volume of a first thermally conductive filler material having an aspect ratio of at least 10:1, and (iii) about 10 to about 15% by volume of a second thermally conductive filler material having an aspect ratio of 5:1 or less.

The filler material may be selected from the group consisting of aluminum, alumina, copper, magnesium, brass, carbon, silicon nitride, aluminum nitride, boron nitride, and zinc oxide. Preferably, the filler material is alumina or boron nitride. The filler material can be in any suitable form such as granular powder, whiskers, or fibers.

BRIEF DESCRIPTION OF THE DRAWINGS

The novel features that are characteristic of the present invention are set forth in the appended claims. However, the preferred embodiments of the invention, together with further objects and attendant advantages, will be best understood by reference to the following detailed description taken in connection with the accompanying drawings in which:

DETAILED DESCRIPTION OF THE PREFERRED EMBODIMENT

Figure 1:
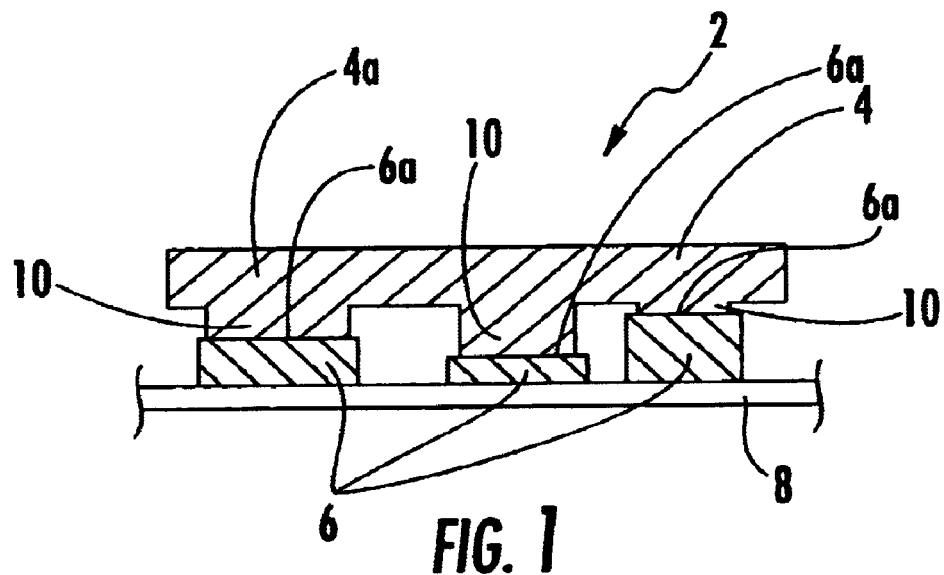
FIG. 1 is a cross-sectional view of an assembly showing an elastomeric pad of the present invention and a circuit board containing heat-generating elements.

The present invention relates to thermally conductive elastomeric pads and methods for making such pads.

The thermally conductive composition used to make the pads of this invention comprises an elastomer polymer matrix. Suitable elastomers include, for example, styrene-butadiene copolymer, polychloroprene, nitrile rubber, butyl rubber, polysulfide rubber, ethylene-propylene terpolymers, polysiloxanes, and polyurethanes. Preferably, the elastomer polymer is a polysiloxane (silicone). The polymer matrix preferably constitutes 30% to 60% by volume of the total composition. It is important that the matrix comprise an elastomer polymer. The matrix provides the pad with rubber-like consistency, elasticity, and texture. Because of these rubber-like properties, the pad can provide an effective interface between the heat-generating and heat-dissipating devices as discussed in further detail below.

Thermally conductive filler materials are added to the polymer matrix. Suitable filler materials include, for example, aluminum, alumina, copper, magnesium, brass, carbon, silicon nitride, aluminum nitride, boron nitride, zinc oxide, and the like. Mixtures of such fillers are also suitable. The filler material preferably constitutes 25% to 70% by volume of the composition and is more preferably less than 60%.

The filler material may be in the form of granular powder, whiskers, fibers, or any other suitable form. The granules can have a variety of structures. For example, the grains can have flake, plate, rice, strand, hexagonal, or spherical-like shapes. The filler material may have a relatively high aspect (length to thickness) ratio of about 10:1 or greater. For example, PITCH-based carbon fiber having an aspect ratio of about 50:1 can be used. Alternatively, the filler material may have a relatively low aspect ratio of about 5:1 or less. For example, boron nitride grains having an aspect ratio of about 4:1 can be used. Preferably, both low aspect and high aspect ratio filler materials are added to the polymer matrix as described in McCullough, U.S. Pat. Nos. 6,251,978 and 6,048,919, the disclosures of which are hereby incorporated by reference.

In one preferred embodiment, the composition comprises: i) about 30 to about 60% by volume of an elastomer polymer matrix, ii) about 25 to about 60% by volume of a first thermally conductive filler material having an aspect ratio of 10:1 or greater, and (iii) about 10 to about 15% by volume of a second thermally conductive filler material having an aspect ratio of 5:1 or less. More particularly, the composition can comprise about 50% by volume of the elastomer polymer matrix; about 35% by volume of the first thermally conductive filler material; and about 15% by volume of the second thermally conductive filler material.

The filler material may be electrically conductive for applications where efficient electrical transmission is needed. Particularly, the filler material may be selected so that the ultimate composition has a volume resistivity of approximately 0.1 ohm-cm or lower and a surface resistivity of approximately 1.0 ohm or lower. Thus, the resultant elastomeric pad may be thermally conductive and/or electrically conductive.

The filler material is intimately mixed with the non-conductive elastomer polymer matrix. The loading of the filler material in the matrix imparts thermal conductivity to the composition. The mixture can be prepared and molded into a thermally conductive, elastomeric pad using techniques known in the art. First, the ingredients are preferably mixed under low shear conditions in order to avoid damaging the structure of the filler material. The composition may then be shaped into the elastomeric pad using any suitable molding process such as melt-extrusion, casting, or injection-molding. The composition is preferably injection-molded using conventional techniques employed to produce plastics and other molded materials. These techniques generally involve the following steps: (a) feeding the composition into the heating chamber of a molding machine and heating the composition to form a molten composition; b) injecting the molten composition into a mold cavity; c) maintaining the composition in the mold under high pressure until it cools, and d) removing the molded article.

The elastomeric pad of this invention is thermally conductive. Preferably, the pad has a thermal conductivity of greater than 3 W/m° K., and more preferably greater than 22 W/m° K. In addition, the elastomeric pad is net-shape molded meaning that the final shape of the pad is determined by the shape of the mold cavity. No further processing or tooling is required to produce the final shape of the pad. The pad produced by this method is ready for use. If desired, various known adhesive materials can be applied either during manufacture or at the time of assembly to adhere the pad to the heat-generating (electrical part) and heat-dissipating devices (heat sink).

In practice, the heat-generating and/or heat sink components may have small voids and other minor manufacturing defects on their surfaces. When these components are brought together, small gaps may appear in the interface between the components. The elastomeric pads of the present invention solve this problem by providing a tightly conforming interface. These rubber-like pads are highly compressible and can conform to voids located on the components' surfaces, thereby creating an effective seal. Further, the interface pads of the present invention are substantially non-corrosive and will not creep or bleed-out under applied pressure.

In contrast, many conventional pre-formed films do not have good compressibility resulting in poor intimate contact between the surfaces of the heat sink and heat-generating source.

The elastomeric interface pads of the present invention offer other advantages over conventional pre-formed films. As discussed above, the pads can be molded to any desired shape. Thus, it is not necessary to die-cut the pads to obtain a specific structure. This ability to net-shape mold the compositions is beneficial, because die-cutting operations can generate substantial amounts of material waste.

Further, the elastomeric pad can vary in thickness and contain numerous recesses and protrusions along its contour. As a result, the surface of the pad can span over adjacent heat-generating elements (e.g., memory chips) on a circuit board despite the fact that the elements may be of varying heights.

Such an assembly 2 is illustrated in FIG. 1, where an elastomeric pad 4 made in accordance with the present invention spans over multiple heat-generating elements 6 on circuit board 8. The heat generating elements 6 may be, for example, microprocessor or RAM electronic devices. The protruding sections 10 of the pad 4 form a thermal interface 12 with the elements. The layout and arrangement of the protruding sections are customized to match the layout and arrangement of the elements 6 to be cooled on circuit board 8. In this embodiment, the top surface 6a of the elements 6 are in contact with the elastomeric pad 4 of the present invention.

Figure 2:
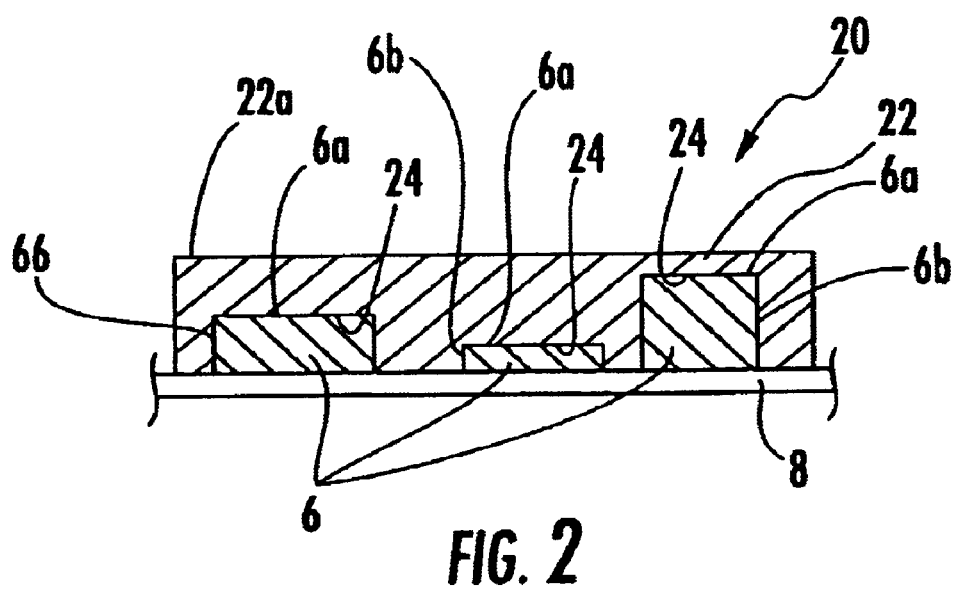
FIG. 2 is a cross-sectional view of an assembly showing another embodiment of the elastomeric pad of the present invention and a circuit board containing heat-generating elements.

In FIG. 2, an alternative embodiment 20 of an elastomeric pad 22 made in accordance with the present invention is shown. This pad 22 contains multiple recesses 24 that form a thermal interface with the elements 6 on the circuit board 8. In this embodiment 20, the pad 22 is sized so that the recesses correspond with the elements 6 on the circuit board 8. Further, the pad is communicates with the top sides 6a as well as the sides 6b of the elements 6 for improved thermal transfer. It may be more desirable to use the pad of FIG. 2 rather than the pad of FIG. 1 to suit the application at hand, namely, the nature of the circuit board 8 and the elements 6 to be cooled.

Under uniformly applied pressure, the elastomeric pads 4 and 22 intimately contact the heat-generating surfaces of each element 6 while allowing a flat opposing surface 4a and 22a upon which a heat sink (not shown) can be installed. For example, a machined block heat sink can be clamped to the circuit board 8 with the gap pad 4 or 22 and elements 6 residing therebetween. This feature is a particular improvement over conventional interfaces that are generically flat in profile and require a separate interface pad for each component.

It is appreciated by those skilled in the art that various changes and modifications can be made to the illustrated embodiments without departing from the spirit of the present invention. All such modifications and changes are intended to be covered by the appended claims.

What is claimed is:

1. A method of making a thermally-conductive, elastomeric pad, comprising the steps of:
   a) injecting a molten composition into a mold, said composition comprising: i) about 30 to 60by volume of an elastomer polymer matrix, ii) about 25 to about 60by volume of a first thermally conductive filler material having an aspect ratio of 10:1 or greater, and (iii) about 10 to about 15% by volume of a second thermally conductive filler material having an aspect ratio of 5:1 or less;
   b) cooling the composition, and
   c) removing the composition from the mold.

2. The method of claim 1, wherein the composition has a thermal conductivity of greater than 3 W/m° K.

3. The method of claim 1, wherein the elastomer polymer is selected from the group consisting of styrene-butadiene copolymer, polychloroprene, nitrile rubber, butyl rubber, polysulfide rubber, ethylene-propylene terpolymers, polysiloxanes, and polyurethanes.

4. The method of claim 1, wherein the first and second filler materials are selected from the group consisting of aluminum, alumina, copper, magnesium, brass, carbon, silicon nitride, aluminum nitride, boron nitride, and zinc oxide.

5. The method of claim 1, wherein the composition comprises: i) about 50 % by volume of the elastomer polymer matrix, ii) about 35 % by volume of the first thermally conductive filler material, and (iii) about 15 % by volume of the second thermally conductive filler material.

* * * * *